United States Patent
Yamada

(10) Patent No.: US 7,535,984 B2
(45) Date of Patent: May 19, 2009

(54) CLOCK ADJUSTMENT APPARATUS AND METHOD THEREOF

(75) Inventor: Jun Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 707 days.

(21) Appl. No.: 10/982,852

(22) Filed: Nov. 8, 2004

(65) Prior Publication Data

US 2005/0281365 A1 Dec. 22, 2005

(30) Foreign Application Priority Data

Jun. 17, 2004 (JP) ............... 2004-180041

(51) Int. Cl.
- *H04L 7/00* (2006.01)
- *H03K 11/00* (2006.01)
- *G06F 1/00* (2006.01)
- *H04B 3/46* (2006.01)
- *H03K 9/00* (2006.01)
- *G06F 13/42* (2006.01)

(52) U.S. Cl. .......... 375/371; 375/215; 375/226; 375/316; 713/501; 713/500; 713/400; 713/401

(58) Field of Classification Search ........ 375/215, 375/240.28, 316, 327, 355, 359, 368, 371, 375/376, 326, 221, 226; 713/400–401, 500–501
See application file for complete search history.

(56) References Cited

U.S. PATENT DOCUMENTS

| | | | | |
|---|---|---|---|---|
| 4,868,522 A | * | 9/1989 | Popat et al. ............... 331/2 |
| 5,081,655 A | | 1/1992 | Long | |
| 5,197,086 A | * | 3/1993 | Jackson et al. ............... 375/373 |
| 5,369,640 A | * | 11/1994 | Watson et al. ............... 714/700 |
| 5,528,186 A | | 6/1996 | Imamura ............... 327/266 |
| 5,852,380 A | * | 12/1998 | Yamauchi ............... 327/243 |
| 6,157,247 A | * | 12/2000 | Abdesselem et al. ............ 327/540 |
| 6,297,680 B1 | * | 10/2001 | Kondo ............... 327/278 |
| 6,313,676 B1 | * | 11/2001 | Abe et al. ............... 327/158 |
| 6,417,706 B2 | * | 7/2002 | Kondo ............... 327/158 |
| 6,539,072 B1 | * | 3/2003 | Donnelly et al. ............ 375/371 |
| 6,867,630 B1 | * | 3/2005 | Talledo et al. ............... 327/284 |
| 7,130,367 B1 | * | 10/2006 | Fu et al. ............... 375/376 |

(Continued)

FOREIGN PATENT DOCUMENTS

DK EP0256637 A2 * 6/1987

(Continued)

OTHER PUBLICATIONS

Che, Wenquan; "Phase-Adjustment Technique of the Digital-latching Ferrite Phase Shifter", Microwave Theory and Techniques, IEEE Transactions on vol. 47, Issue 7, Part 1, Jul. 1999 pp. 1125-1127.*

A new method for digital PLL control using estimated quadrature two phase frequency detection Sakamoto, S.; Izumi, T.; Yokoyama, T.; Haneyoshi, T.; Power Conversion Conference, 2002. PCC Osaka 2002. Proceedings of the vol. 2, Apr. 2-5, 2002 pp. 671-676 vol. 2.*

(Continued)

*Primary Examiner*—Mohammad H Ghayour
*Assistant Examiner*—Sarah Hassan
(74) *Attorney, Agent, or Firm*—Staas & Halsey LLP

(57) ABSTRACT

A clock adjustment apparatus delays a clock signal and adjusts a phase of the signal, thereby increasing or decreasing a delay amount of the clock signal in accordance with a phase relation between a data signal and an adjusted clock signal. The adjusted clock signal is used for receiving the data signal.

13 Claims, 25 Drawing Sheets

U.S. PATENT DOCUMENTS

| | | |
|---|---|---|
| 2002/0051510 A1 | 5/2002 | Noguchi |
| 2003/0085744 A1 | 5/2003 | Heo et al. |
| 2003/0210577 A1* | 11/2003 | Okuda et al. ............ 365/189.07 |
| 2003/0218483 A1 | 11/2003 | Yoshioka |
| 2004/0251936 A1* | 12/2004 | Gomm ........................ 327/141 |

FOREIGN PATENT DOCUMENTS

| | | |
|---|---|---|
| EP | 1 381 153 A1 | 1/2004 |
| FR | 2 818 467 | 6/2002 |
| JP | 5-258476 | 10/1993 |
| JP | 2000-65902 * | 3/2000 |
| JP | 2002-135093 | 5/2002 |
| WO | WO 02/39586 A2 | 5/2002 |

OTHER PUBLICATIONS

European Search Report dated Jun. 22, 2005 for European Patent Application No. 04256897.2-1233.

Extended European Search Report, mailed Feb. 23, 2007 and issued in corresponding European Patent Application No. 06026673.1-1233.

* cited by examiner

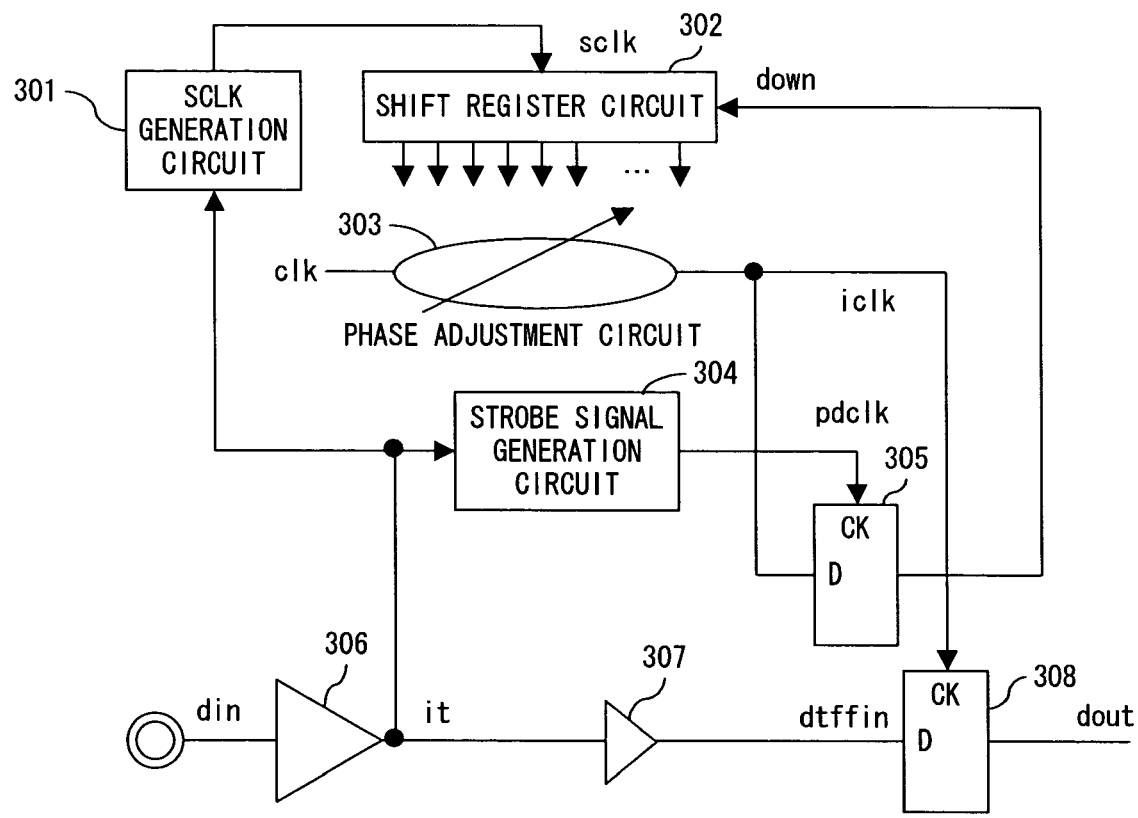
F I G. 3

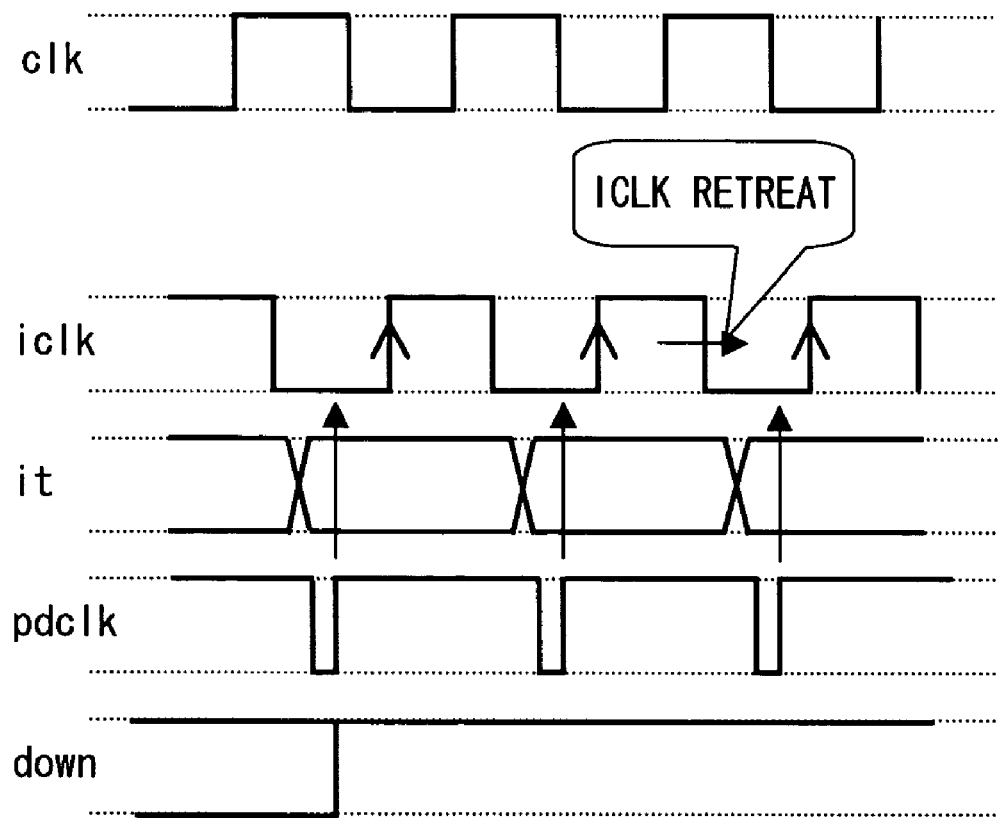
F I G. 5

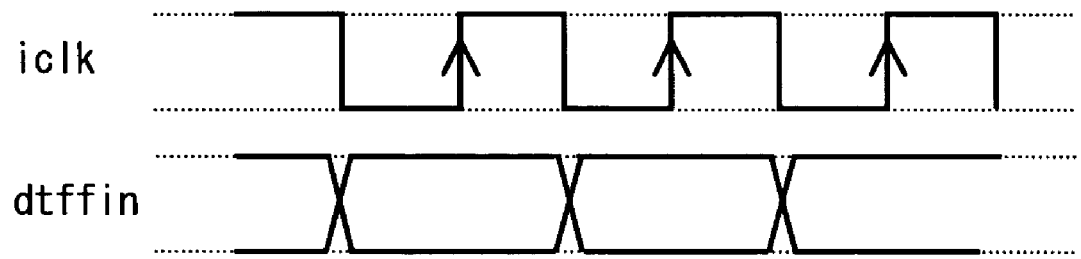
F I G. 6

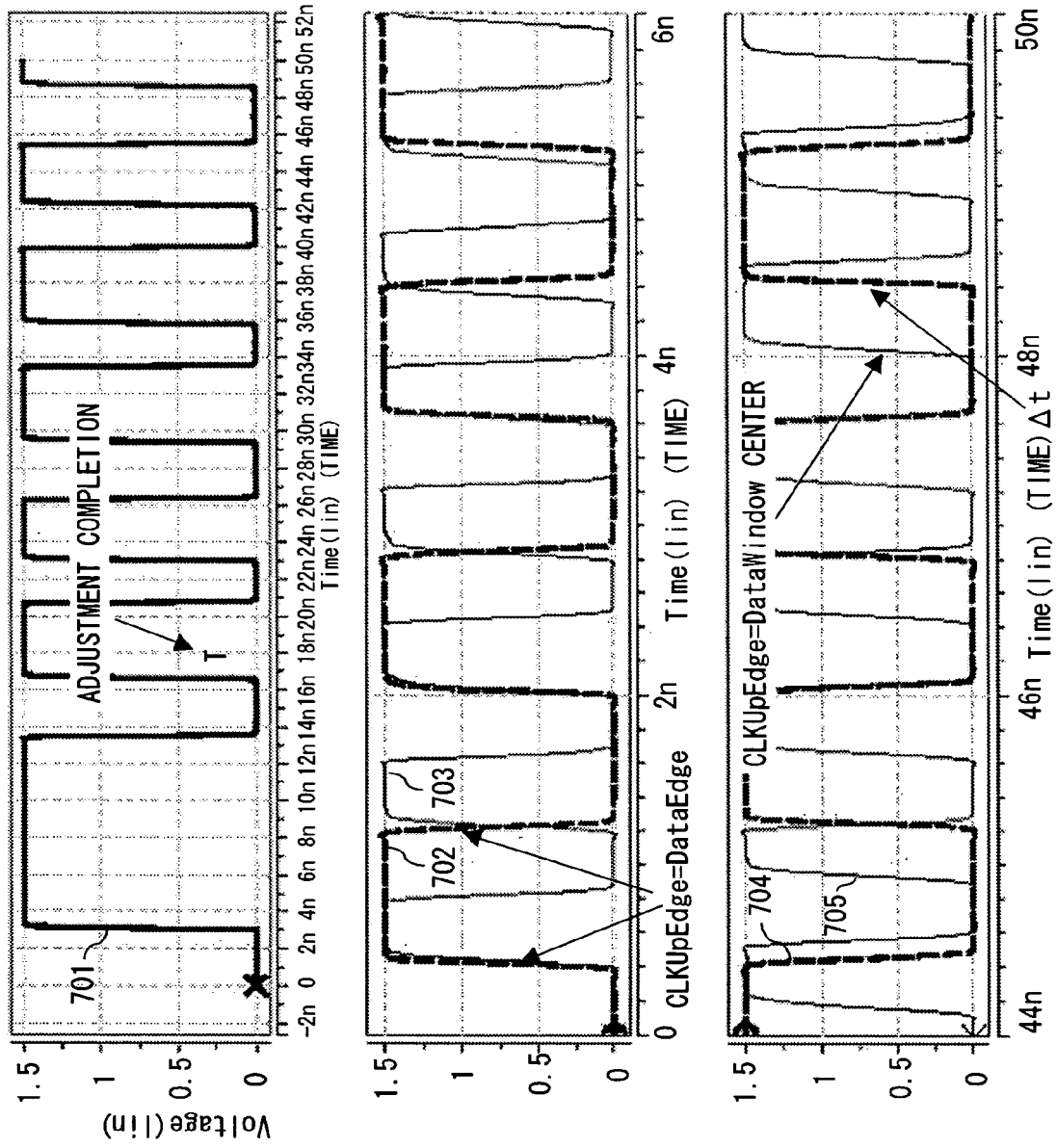
F I G. 7

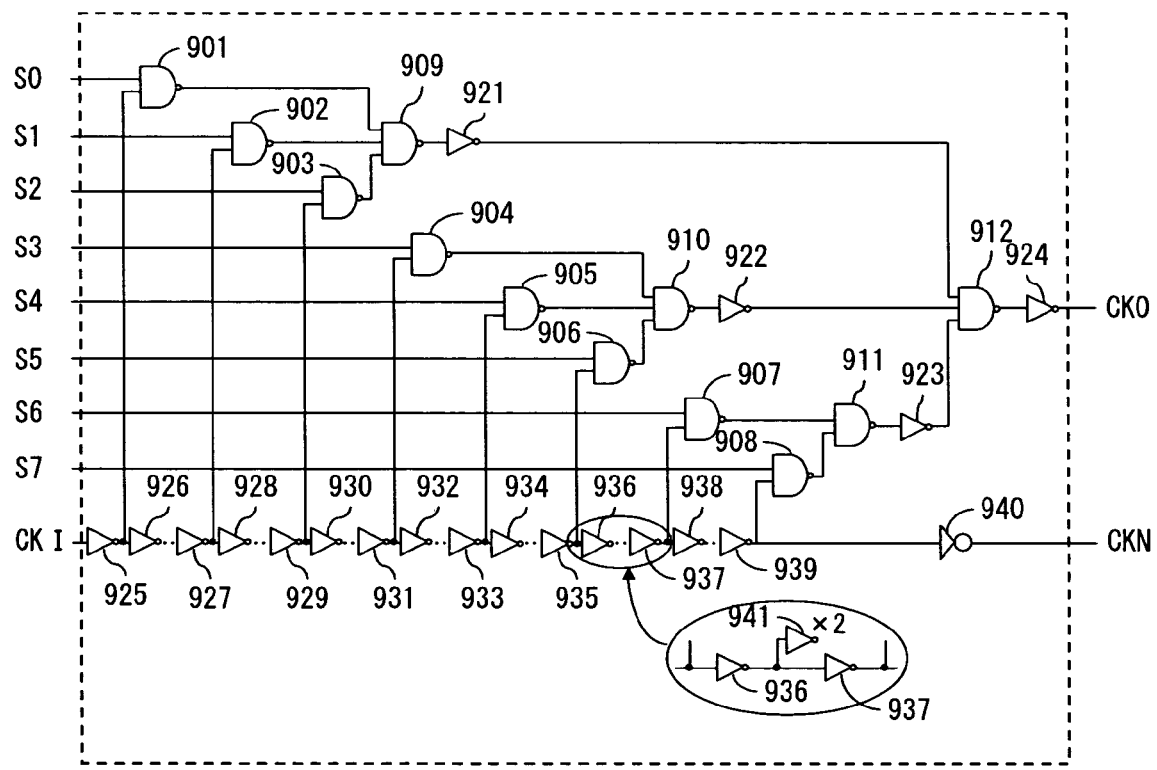
F I G. 9

|       | Case |     |     |     |     |     |     |     |
|-------|------|-----|-----|-----|-----|-----|-----|-----|
|       | 00   | 01  | 02  | 03  | 04  | 05  | 06  | 07  |
| SEL1  | Off  | On  | Off | On  | Off | On  | Off | On  |
| SEL2  | Off  | Off | On  | On  | Off | Off | On  | On  |
| SEL3  | Off  | Off | Off | Off | On  | On  | On  | On  |
| DELAY | 0    | +1  | +2  | +3  | +4  | +5  | +6  | +7  |

F I G. 1 2

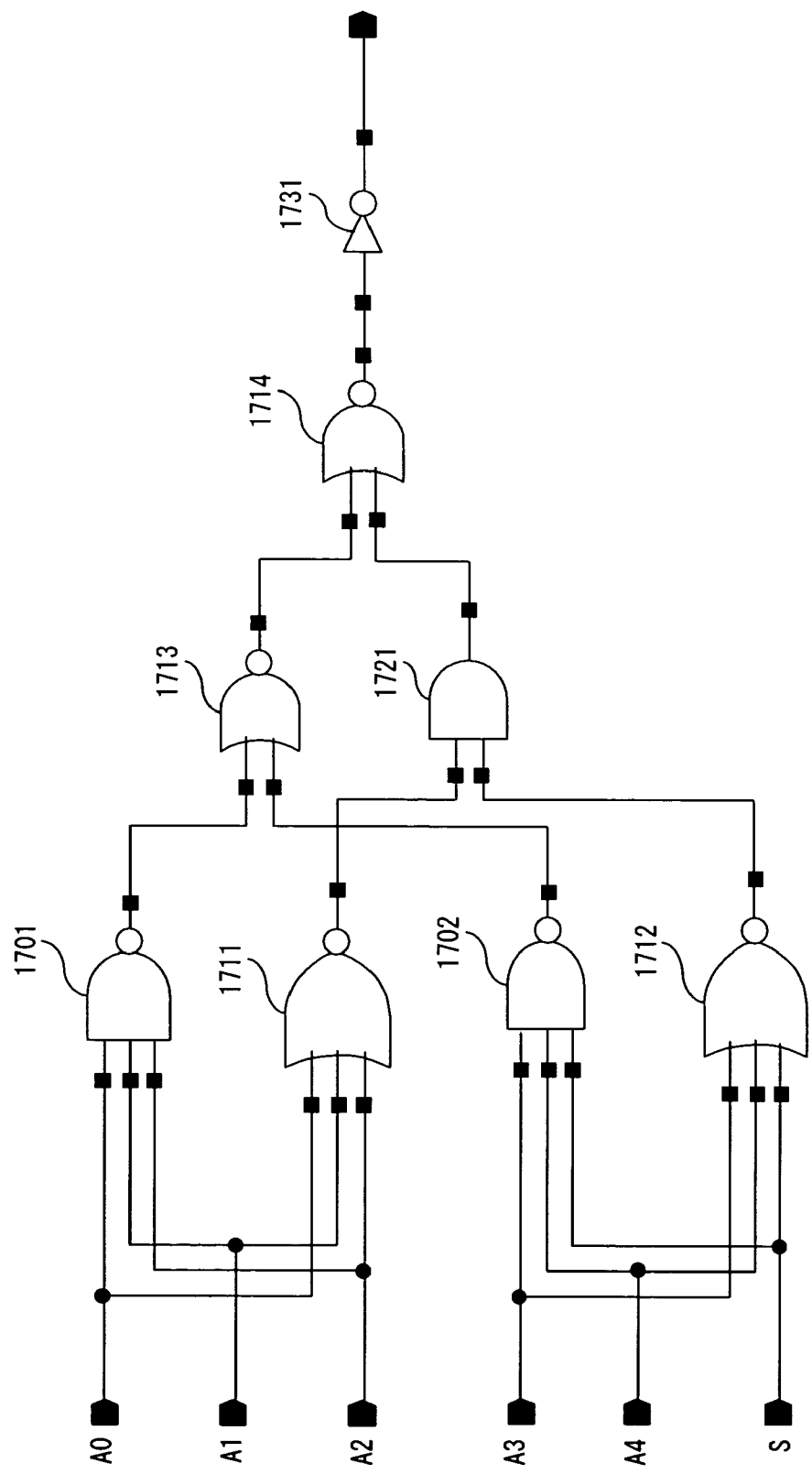
F I G. 17

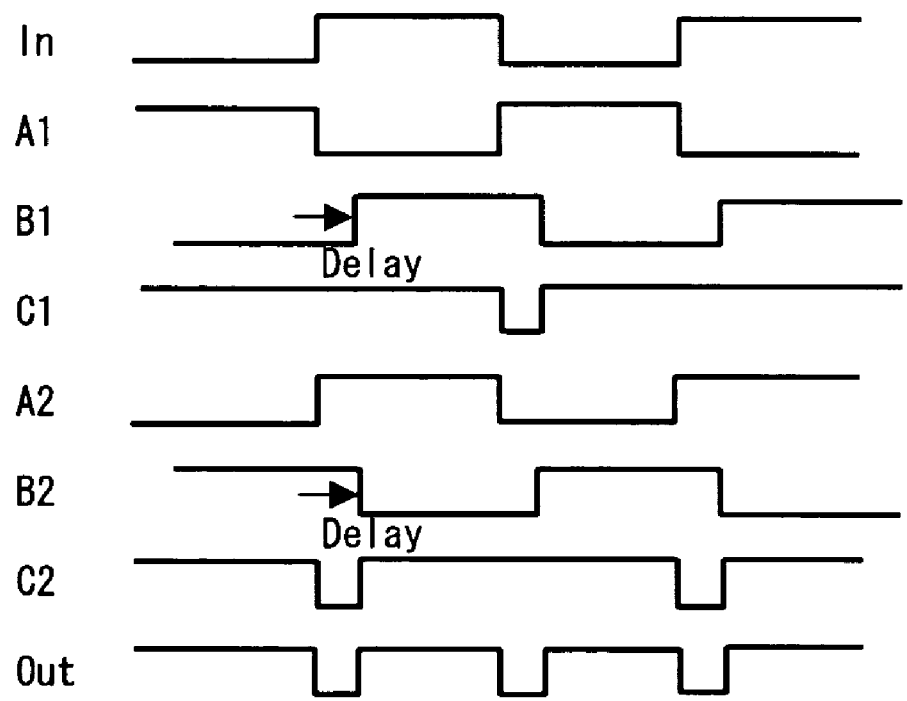
F I G. 1 9

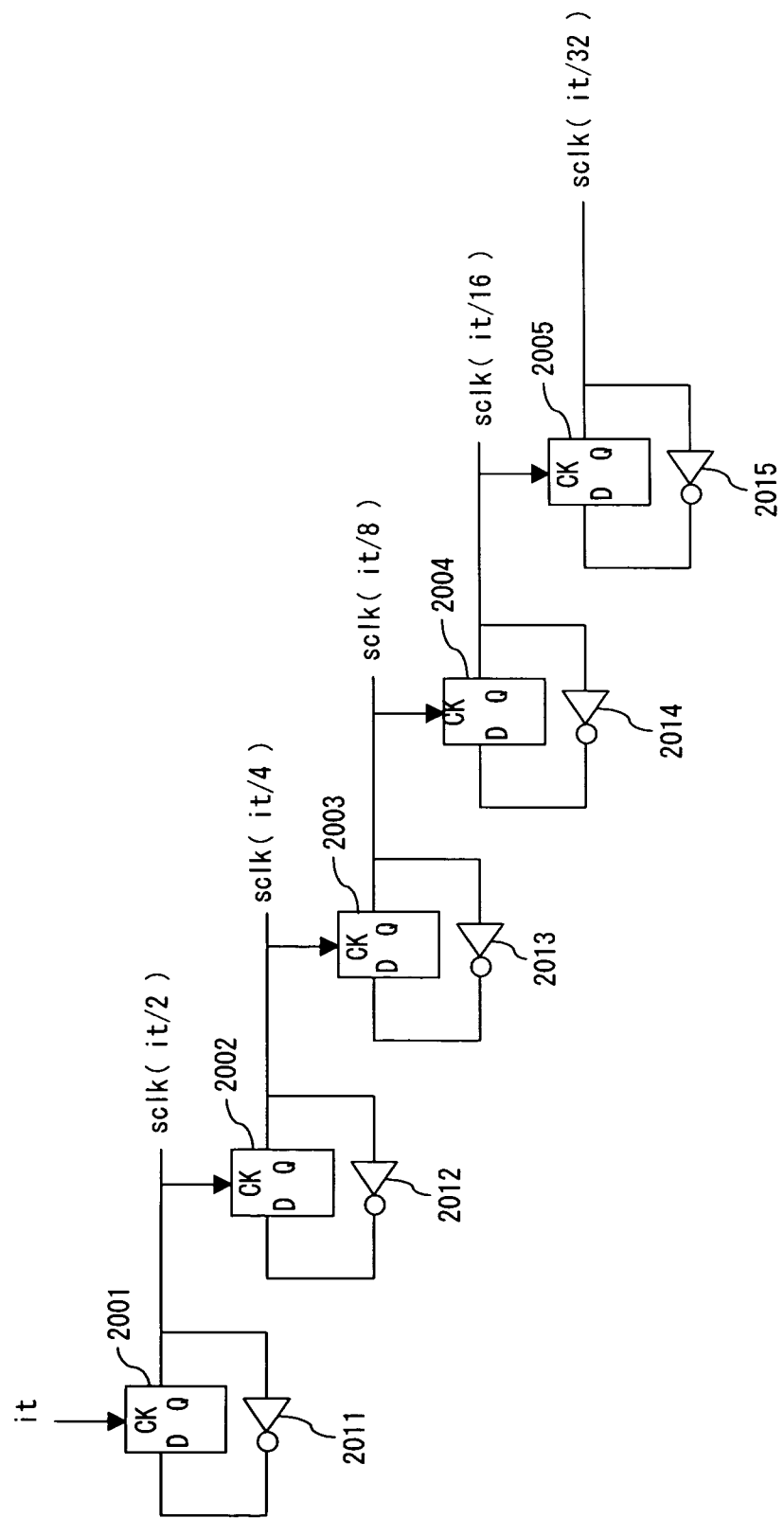
F I G. 20

CLOCK ADJUSTMENT APPARATUS AND METHOD THEREOF

BACKGROUND OF THE INVENTION

1. Field of the Invention

The present invention relates to a signal transmission and reception circuit to be used for high speed digital transmission using a bus etc. inside a computer and specifically it relates to an apparatus and a method of adjusting the clock of a reception apparatus.

2. Description of the Related Art

A conventional transmission method of synchronizing clock signals between a transmission apparatus and a reception apparatus includes mainly following two methods which are performed in a signal transmission and reception processing between the processor LSI (Large Scale Integration) circuit and the chip set LSI circuit of a computer.

(a) Synchronous system

As shown in FIG. 1A, clock signals are respectively distributed to a transmission apparatus 102 and a reception apparatus 103 as a strobe signal from a clock driver (CLK driver) 101 and data signals are transferred between these apparatuses.

(b) Source Synchronous system

As shown in FIG. 1B, a clock signal is transmitted at the same time a data signal is transmitted to the reception apparatus 105 from the transmission apparatus 104 and then the reception apparatus 105 receives data using the clock signal.

In addition, a phase frequency comparison circuit and a signal processing circuit for delaying a clock signal are well-known (for example, refer to patent literatures 1 and 2).

[Patent literature 1] Japanese laid-open patent application publication No. 2002-135093

[Patent literature 2] Japanese laid-open patent application publication No. 05-258476

However, there is the following problem in the above-mentioned conventional transmission systems.

In the synchronous system (a), the clock signal and data signal are relatively lagged by both the piece-to-piece variations and a temperature/voltage fluctuation so that this system is not available for high speed transmission.

In the source synchronous system (b), the tolerance to the piece-to-piece variations and a temperature/voltage fluctuation are improved, but the time lag between a clock signal and a data signal becomes a problem when they are used in ultra-high speed transmission. Furthermore, in the case of the data signal of a plurality of bits, a design for generating equal time lags between bits becomes required since the variation in wiring lengths among bits, etc. at the time of drawing a design influences these data signals.

SUMMARY OF THE INVENTION

The present invention aims at offering a clock adjustment apparatus and a method thereof for improving the time lag between a clock signal and a data signal in a reception apparatus without transmitting a clock signal from a transmission apparatus to the reception apparatus.

A clock adjustment apparatus of the present invention comprises a phase adjustment device, a phase detection device and a control device. The phase adjustment device delays an inputted clock signal and adjusts a phase of the inputted clock signal, thereby outputting the adjusted clock signal. The phase detection device detects a phase relation between the inputted data signal and the adjusted clock signal and outputs a first control signal showing this phase relation. The control device determines whether a delay amount of the phase adjustment device is increased or decreased in accordance with the first control signal and generates a second control signal for increasing or decreasing the delay amount in accordance with an inputted timing signal, thereby outputting the generated second control signal to the phase adjustment device.

BRIEF DESCRIPTION OF THE DRAWINGS

FIG. 3 shows the configuration of a data reception circuit;

FIG. 5 is a timing chart of retreating iclk;

FIG. 6 is a timing chart of each of iclk and dtffin;

FIG. 7 shows simulation results;

FIG. 9 shows the configuration of the first phase adjustment block;

FIG. 12 shows a control signal;

FIG. 17 shows the configuration of a digit-overflow detection circuit;

FIG. 19 is the timing chart of a signal inside the strobe signal generation circuit;

FIG. 20 shows the configuration of the first sclk generation circuit;

DESCRIPTION OF THE PREFERRED EMBODIMENTS

The following is the detailed explanation of the preferred embodiments of the present invention in reference to the drawings.

Figure 1A:
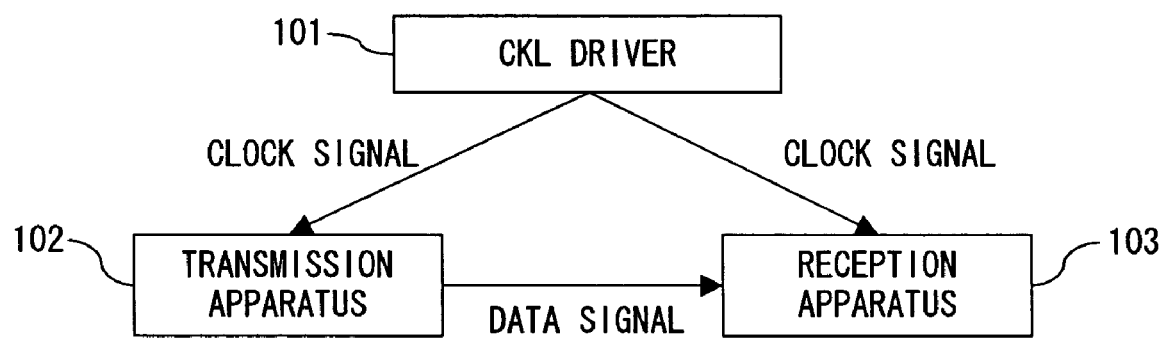
FIG. 1A shows a synchronous transmission system.
Figure 1B:
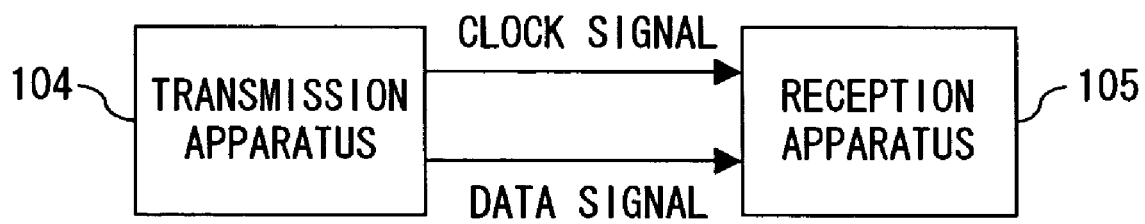
FIG. 1B shows a source synchronous transmission system.
Figure 2A:
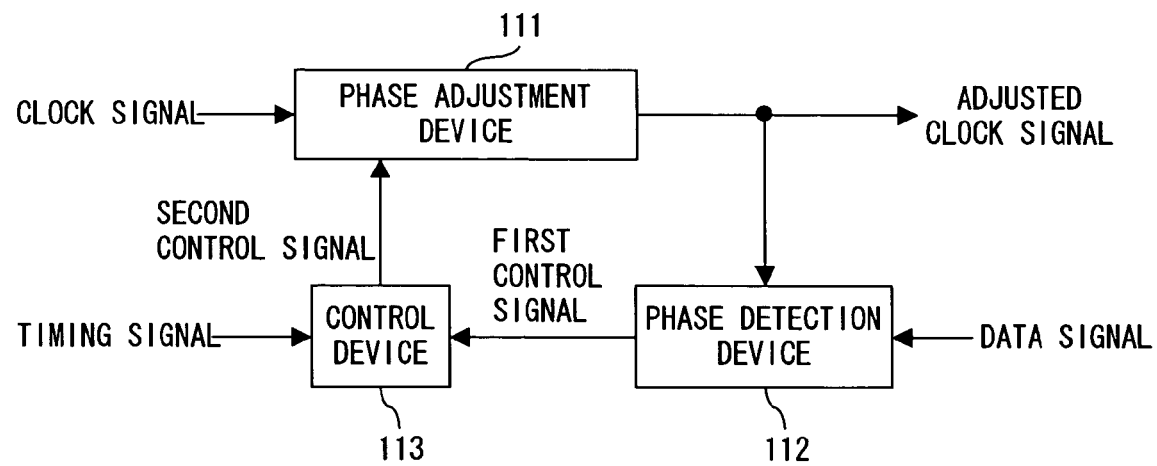
FIG. 2A shows the principle of a clock adjustment apparatus of the present invention.

FIG. 2A shows the principle of a clock adjustment apparatus of the present invention. A clock adjustment apparatus of FIG. 2A comprises a phase adjustment device 111, a phase detection device 112 and a control device 113.

The phase adjustment device 111 delays an inputted clock signal and adjusts a phase of the delayed clock signal, thereby outputting the adjusted clock signal. The phase detection device 112 detects a phase relation between an inputted data signal and the adjusted clock signal and outputs a first control signal showing this phase relation. The control device 113 determines whether a delay amount of the phase adjustment device 111 is increased or decreased in accordance with the first control signal and generates a second control signal for increasing or decreasing the delay amount in accordance with an inputted timing signal, thereby outputting the generated second control signal to the phase adjustment device 111.

When a clock signal is inputted to the clock adjustment apparatus, the phase adjustment device 111 with a variable delay amount applies to the clock signal the delay amount that is instructed by the second control signal and outputs the delayed clock signal. The phase detection device 112 detects the phase relation between the data signal transmitted from a transmission apparatus and the clock signal outputted from the phase adjustment device 111 and it outputs the first control signal. The control device 113 determines whether a delay amount is increased or decreased in accordance with a value of the first control signal and generates a second control signal in synchronization with the timing signal, thereby outputting the second control signal to the phase adjustment device 111.

The phase adjustment device 111 corresponds to, for example, a phase adjustment circuit 303 of FIG. 3 that is described later. The phase detection device 112 corresponds to, for example, a strobe signal generation circuit 304 and a flip-flop circuit 305 of FIG. 3. The control device 113 corresponds to, for example, a shift register circuit 302 of FIG. 3. The first control signal corresponds to, for example, "down" of FIG. 3 and the second control signal corresponds to, for example, S0 to S31 of FIG. 14 and SS0 to SS4 of FIG. 16 that are described later.

According to the present invention, a clock signal generated on the side of a reception apparatus can be synchronized with a data signal without transmitting the clock signal to the reception apparatus from the transmission apparatus. Therefore, it becomes possible to amend not only the timing lag caused by piece-to-piece variations but also the timing lag caused by a temperature/voltage fluctuation in operation.

Furthermore, if a clock adjustment apparatus is provided for each bit, the timing lag caused by variations in wiring lengths among bits, etc. can be amended.

Figure 2B:
FIG. 2B shows a data synchronous transmission system.

In this preferred embodiment, the clock signal generated in a reception apparatus 202 is automatically synchronized with a data signal by utilizing the phase information of an edge of the data signal without transmitting the clock signal to the reception apparatus 202 from a transmission apparatus 201 as shown in FIG. 2B and then data transmission is performed. In order to prevent the lag between a clock signal and a data signal in a long operation, the clock sources of a transmission apparatus and a reception apparatus may be made the same. According to such a data synchronous system, a conventional circuit can be used without change as the transmission apparatus 201.

FIG. 3 shows the configuration of a data reception circuit that is provided in the reception apparatus 202 of FIG. 2B. The data reception circuit of FIG. 3 comprises a sclk generation circuit 301, a shift register circuit 302, a phase adjustment circuit 303, a strobe signal generation circuit 304, flip-flop circuits 305 and 308, an input circuit 306 and a delay circuit 307.

The input circuit 306 receives a data signal din that is transmitted from the transmission apparatus 201 and outputs this signal to the delay circuit 307 as a data signal it. A data signal dtffin that is delayed by a specified time by the delay circuit 307 is inputted to a terminal D of the flip-flop circuit 308.

The sclk generation circuit 301 generates a timing signal sclk from the data signal it and outputs this signal to the shift register circuit 302. The shift register circuit 302 generates a control signal for the phase adjustment circuit 303 in accordance with a control signal down that is outputted from the flip-flop circuit 305. Then, the phase adjustment circuit 303 adjusts the phase of a clock signal clk in accordance with the control signal from the shift register circuit 302 and generates a clock signal iclk. The generated clock signals iclk are inputted to a terminal D of the flip-flop circuit 305 and a terminal CK of the flip-flop 308. For example, an adjustment notch of the phase adjustment circuit 303 is set to 100 ps.

The strobe signal generation circuit 304 generates a clock signal pdclk from rising/falling (up/down) edge of the data signal it. The generated clock signal pdclk is inputted to a terminal CK of the flip-flop circuit 305.

The flip-flop circuit 305 functions as a phase detection apparatus for detecting the phase relation between the clock signal iclk and the data signal it and latches the clock signal iclk in accordance with the clock signal pdclk, thereby generating a control signal down. The flip-flop circuit 308 latches the data signal dtffin in accordance with the clock signal iclk and outputs this signal to an inner circuit as a data signal dout.

Figure 4:
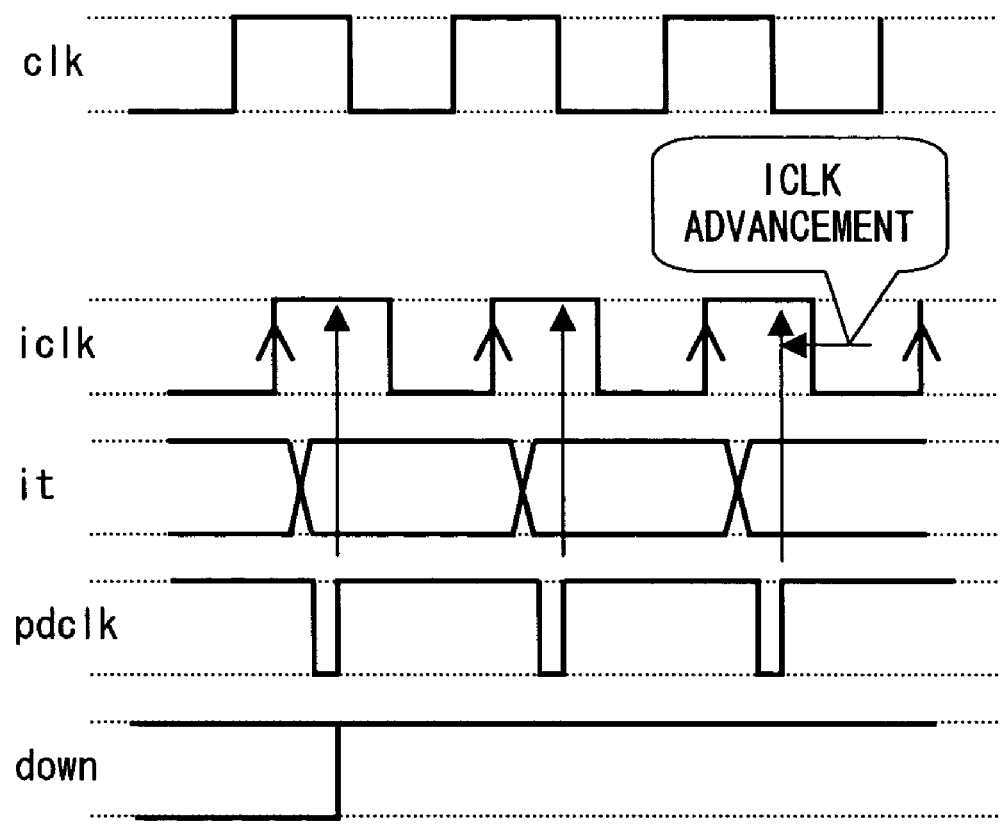
FIG. 4 is a timing chart of iclk advancement.

FIG. 4 is a timing chart of the case of advancing the clock signal iclk. When the signal down is logic '1', the clock signal iclk is advanced by the shift register circuit 302 and the phase adjustment circuit 303. In this way, the down-edge that is an edge different from the effective edge of the clock signal iclk is adjusted in the direction of approaching an edge of the data signal it.

FIG. 5 is a timing chart of the case of retreating the clock signal iclk. When the signal down is logic '0', the clock signal iclk is retreated by the shift register circuit 302 and the phase adjustment circuit 303. In this way, a down-edge of the clock signal iclk is adjusted to approach an edge of the data signal it.

As the results of the phase adjustment like FIGS. 4 and 5, it is adjusted in such a way that the down-edge of the clock signal iclk that is inputted into a terminal CK of the flip-flop circuit 308 matches with an edge of the data signal dtffin that is inputted into a terminal D, as shown in FIG. 6. Since the up-edge that is an effective edge of the clock signal iclk is adjusted to a position where it punches through the middle of two edges of the data signal dtffin, data can be taken in the flip-flop circuit 308 at the best timing.

The fine-adjustment of a timing is performed by adjusting the delay of the delay circuit 307 at the time of drawing a design. The delay of the delay circuit 307 is set up, for example, in accordance with the delay of the strobe signal generation circuit 304.

FIGS. 4, 5 and 6 show the case where an up-edge of the clock signal iclk is an effective edge. In the case where a down-edge of the clock signal iclk is an effective edge, however, the movement direction of the clock signal iclk becomes opposite.

FIG. 7 shows the result of the simulation of such phase adjustment using a circuit simulator. In FIG. 7, a vertical axis expresses the voltage level of a signal while the horizontal axis shows a time. A solid line 701 shows the transition of the control signal down and phase adjustment completes at time T (near 18 ns).

A broken line 702 and the solid line 703 show the transitions of the data signal dtffin and that of the clock signal iclk before the adjustment completion, respectively. In this example, an up-edge that is the effective edge of the clock signal iclk matches with the up-edge or the down-edge of the data signal dtffin.

A broken line 704 and a solid line 705 show the transitions of the data signal dtffin and that of the clock signal iclk after the adjustment completion, respectively. It is understood that the up-edge of the clock signal iclk moves to the middle of the up-edge and the down-edge of the data signal dtffin by the phase adjustment.

Furthermore, the down-edge of the clock signal iclk does not always match with the edge of the data signal dtffin so that a time lag Δt occurs. This time lag is generated by the adjustment notch (100 ps) of the phase adjustment circuit 303, the chop width (150 ps) of the strobe signal generation circuit 304 and a set-up time/hold time but this time lag can be reduced by improving each element.

According to the data reception circuit like FIG. 3, a clock signal that occurs on the side of the reception apparatus can be synchronized with a data signal without transmitting the clock signal to a reception apparatus from a transmission apparatus. In order to automatically perform phase adjustment, it is sufficient to apply a dummy data signal for a specified time period before the operation of the reception apparatus starts. In addition, since the data reception apparatus does not include an analogue circuit, the circuit scale can be restrained so that the data reception apparatus can be easily applied to a digital transmission circuit such as the bus etc. inside a computer.

Then, the following is the detailed explanation of the configuration and operation of the data reception circuit of FIG. 3 in reference to FIGS. 8 to 23.

Figure 8:
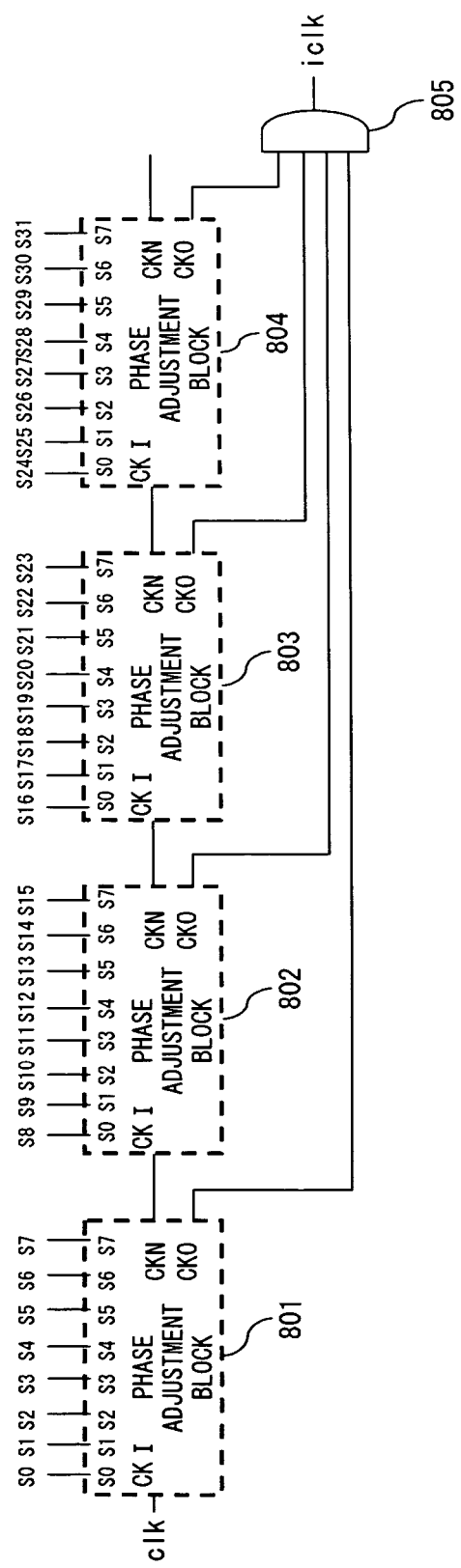
FIG. 8 shows the configuration of the first phase adjustment circuit.

FIG. 8 shows the configuration example of the phase adjustment circuit 303 of FIG. 3. The phase adjustment circuit of FIG. 8 comprises phase adjustment blocks 801 to 804 and an AND circuit 805 and it receives control signals S0 to S31 of thirty-two bits from the shift register circuit 302, thereby adjusting the phase of the clock signal clk.

The phase adjustment block 801 outputs from a terminal CKN the clock signal clk that is inputted from a terminal CKI, adjusts a phase of the clock signal clk in accordance with control signals S0 to S7 and outputs the adjusted clock signal clk from a terminal CKO. The operations of the phase adjustment blocks 802 to 804 are similar to that of the phase adjustment block 801. The AND circuit 805 outputs the logical product of the clock signals that are outputted from the terminals CKO of the phase adjustment blocks 801 to 804 as a clock signal iclk.

FIG. 9 shows the configuration example of the phase adjustment block 801 of FIG. 8. The phase adjustment block of FIG. 9 comprises NAND circuits 901 to 912 and also inverters 921 to 940. The clock signal clk that is inputted from a terminal CKI is delayed by passing through the inverters 925 to 940 that are serially connected. Then, the thus-delayed signal is outputted from a terminal CKN to the next phase adjustment block 802.

In fact, the input terminal of a dummy inverter 941 is connected between an inverter 936 and an inverter 937 that are adjacent to each other and a clock signal is delayed by utilizing the input capacity of this inverter 941. Dummy inverters are similarly connected to the inverters 926 to 935 and also the inverters 938 and 939.

The NAND circuit 901 inverts the logical product of the control signal S0 and the output of the inverter 925 and it outputs the inverted logical product. The NAND circuits 902 to 908 similarly invert the logical product of control signals S1 to S7 and the output of an inverter and they output the inverted logical product. Each of the clock signals that are inputted to NAND circuits 901 to 908 has a constant delay difference from the clock signal that is inputted into the adjacent NAND circuit.

The NAND circuit 909 inverts the logical product of the outputs of the NAND circuits 901 to 903 and outputs the inverted logical product. The NAND circuit 910 inverts the logical product of the outputs of the NAND circuits 904 to 906 and outputs the inverted logical product. The NAND circuit 911 inverts the logical product of the outputs of the NAND circuits 907 and 908 and outputs the inverted logical product. The inverters 921 to 923 invert the outputs of the NAND circuits 909 to 911, respectively. The NAND circuit 912 inverts the logical product of the outputs of the inverters 921 to 923 and outputs the inverted logical product. Then, the inverter 924 inverts the output of the NAND circuit 912 and outputs the inverted output from the terminal CKO.

If any one bit of the control signals S0 to S7 is set to '1' and other bits are set to '0', only the NAND circuit to which the control signal '1' is inputted from among the NAND circuits 901 to 908 inverts a clock signal and passes the inverted clock signal so that all the outputs of other NAND circuits become '1'. Therefore, the clock signal that passes through the circuit is outputted from the terminal CKO.

In this way, the phase adjustment block 801 delays the clock signal clk only by the time period selected by the control signals S0 to S7 and outputs the delayed signal from the terminal CKO. When the control signal S7 is set to '1', the delay time period becomes maximum. Also, if all the control signals S0 to S7 are set to '0', the outputs of the terminal CKO always become '1'.

The configurations of other phase adjustment blocks 802 to 804 are the same as that of the phase adjustment block 801. The difference between delay time periods selected by the control signals S7 and S8 is adjusted to be the same as the difference of delay time periods selected by two adjacent control signals (for example, S6 and S7) of the phase adjustment block 801. The same goes for the difference between delay time periods selected by S15 and S16 and the difference between delay time periods selected by S23 and S24.

If any one bit of the control signal S0 to S31 is set to '1' and other bits are set to '0', a clock signal is outputted from the terminal CKO of the phase adjustment block to which the control signal '1' is inputted and all the outputs of the terminals CKO of other phase adjustment blocks become '1'. Therefore, the clock signals that are adjusted by the phase adjustment blocks are outputted as the clock signal iclk from the AND circuit 805.

In this way, the phase adjustment circuit of FIG. 8 selects a specified delay time period from among delay time periods of thirty-two kinds each having a delay difference and it can apply the specified delay time period to the clock signal clk.

Figure 10:
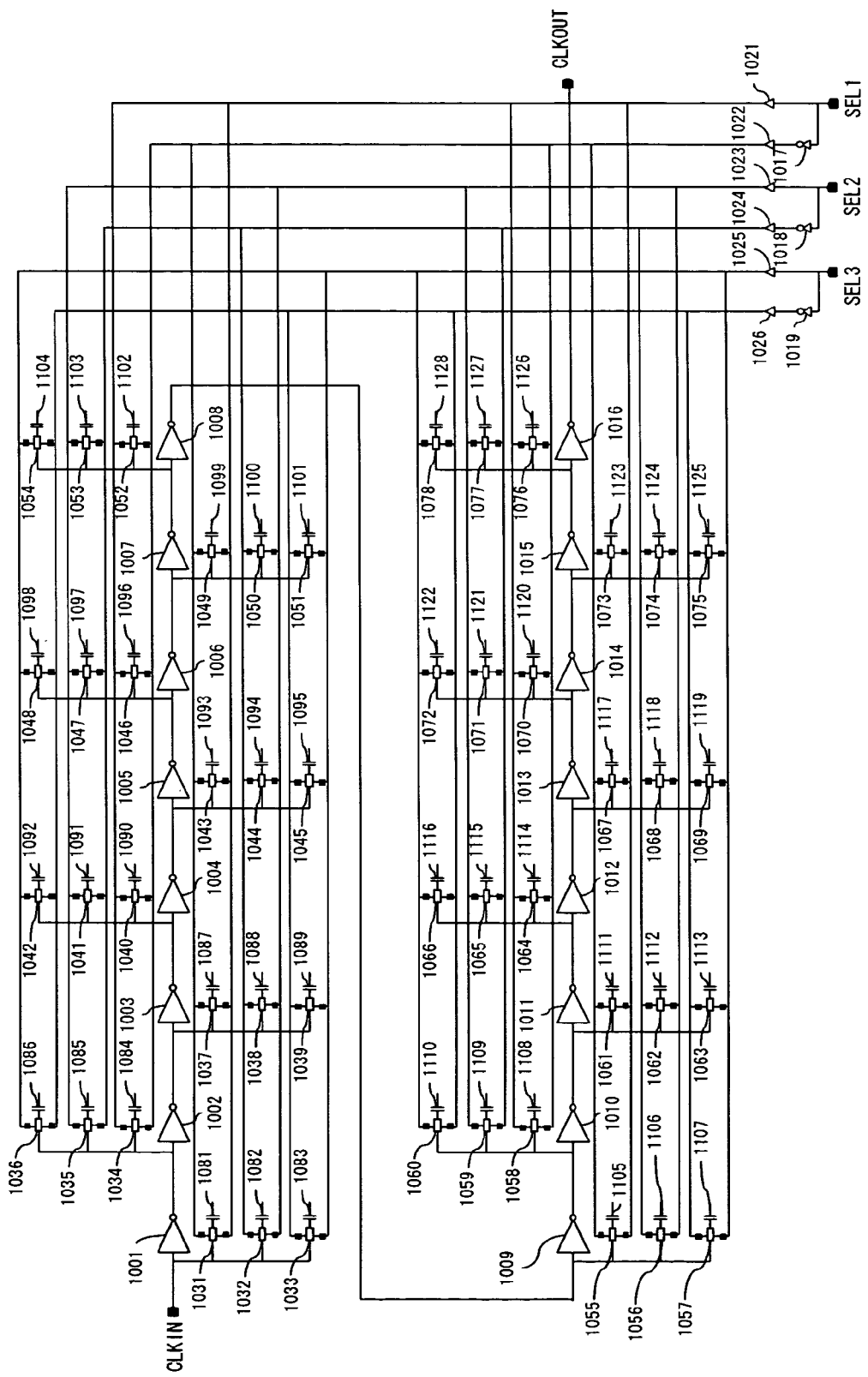
FIG. 10 shows the configuration of the second phase adjustment block.

FIG. 10 shows a phase adjustment block that is used by another different configuration example of the phase adjustment circuit 303 of FIG. 3. The phase adjustment block of FIG. 10 comprises inverters 1001 to 1019, buffers 1021 to 1026, Field Effect Transistor (FET) switches 1031 to 1078 and capacitors 1081 to 1128.

The clock signal clk that is inputted from a terminal CLKIN is delayed by the capacitor that is connected to the input of each inverter through a FET switch by passing through the inverters 1001 to 1016 that are serially connected. Then, the delayed signal is outputted to the next phase adjustment block from a terminal CLKOUT.

In this case, control signals SEL1 to SEL3 of three bits are inputted into a phase adjustment block and each control signal controls one of three FET switches that are connected to the inputs of inverters 1001 to 1016. To each FET switch, two signals such as a control signal and a signal obtained by inverting this control signal are inputted.

Figure 11:
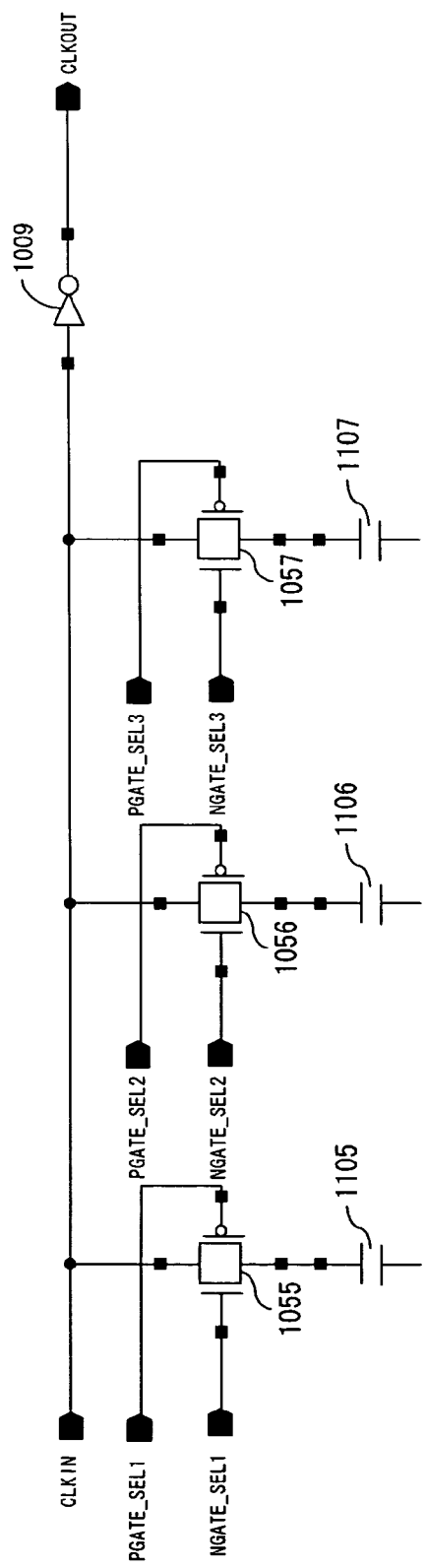
FIG. 11 shows a delay circuit.

FIG. 11 shows an enlarged view of a delay circuit comprising, for example, the inverter 1009, FET switches 1055 to 1057 and capacitors 1105 to 1107. Signals PGATE_SEL1, PGATE_SEL2 and PGATE_SEL3 correspond to outputs of the buffers 1022, 1024 and 1026, respectively. Signals NGA-TE_SEL1, NGATE_SEL2 and NGATE_SEL3 correspond to outputs of the buffers 1021, 1023 and 1025, respectively.

The values of signals NGATE_SEL1, NGATE_SEL2 and NGATE_SEL3 become identical to the values of control signals SEL1, SEL2 and SEL3, respectively. Similarly, the values of signals PGATE_SEL1, PGATE_SEL2 and PGATE_SEL3 become identical to the values of signals that are obtained by inverting control signals SEL1, SEL2 and SEL3, respectively.

A capacity of the capacitor 1106 and that of the capacitor 1107 are two times and four times that of the capacitor 1105, respectively. Even the delay circuits of other inverters are configured in the same way as the delay circuit of FIG. 11 is configured.

The relation among the values of control signals SEL1 to SEL3 and the delay that occurs becomes like FIG. 12. In FIG. 12, 'on' and 'off' show '1' and '0', respectively. If these control signals are used, one delay time period can be selected from among delay time periods of eight kinds each having a constant delay difference.

Figure 13:
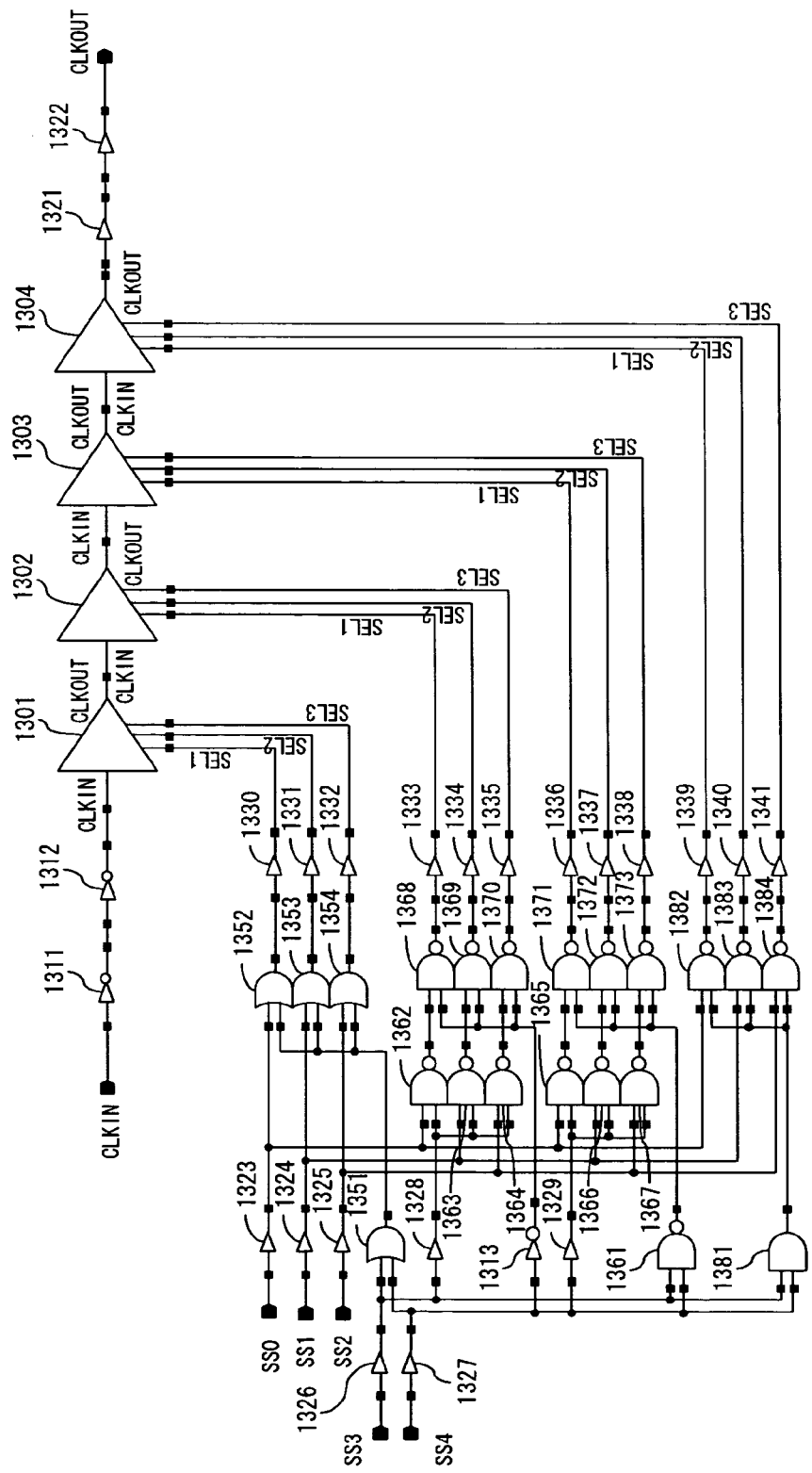
FIG. 13 shows the configuration of the second phase adjustment circuit.

FIG. 13 shows the configuration example of the phase adjustment circuit 303 that uses the phase adjustment block of FIG. 10. The Phase adjustment circuit 303 of FIG. 13 comprises phase adjustment blocks 1301 to 1304, inverters 1311 to 1313, buffers 1321 to 1341, OR circuits 1351 to 1354, NAND circuits 1361 to 1373 and AND circuits 1381 to 1384. This circuit receives control signals SS0 to SS4 of five bits from the shift register circuit 302, thereby adjusting the phase of a clock signal clk.

The clock signal clk that is inputted from the terminal CLKIN on the input side of the inverter 1311 is delayed by passing through the phase adjustment blocks 1301 to 1304 that are serially connected. Then, the delayed clock signal clk is outputted as a clock signal iclk from the terminal CLKOUT on an output side of the buffer 1322.

The values of the control signals SS0 to SS4 correspond to the values obtained by binarizing the control signals S0 to S31 of FIG. 8 and they can express the values of thirty-two kinds. A circuit comprising the inverter 1313, the buffers 1323 to 1341, the OR circuits 1351 to 1354, the NAND circuits 1361 to 1373 and the AND circuits 1381 to 1384 generates a control signal of twelve bits from the control signals SS0 to SS4 and respectively outputs three bits to each of the phase adjustment blocks 1301 to 1304.

The outputs of the buffers 1330 to 1332 are inputted into the phase adjustment block 1301 as control signals SEL1 to SEL3 while the outputs of the buffers 1333 to 1335 are inputted into the phase adjustment block 1302 as control signals SEL1 to SEL3. The outputs of buffers 1336 to 1338 are inputted into the phase adjustment block 1303 as control signals SEL1 to SEL3 while the outputs of the buffers 1339 to 1341 are inputted into the phase adjustment block 1304 as control signals SEL1 to SEL3.

A specified delay time period is selected by these control signals from among the delay time periods of thirty two kinds each having a constant delay difference in a whole phase adjustment circuit and this specified time period can be applied to the clock signal clk.

Figure 14:
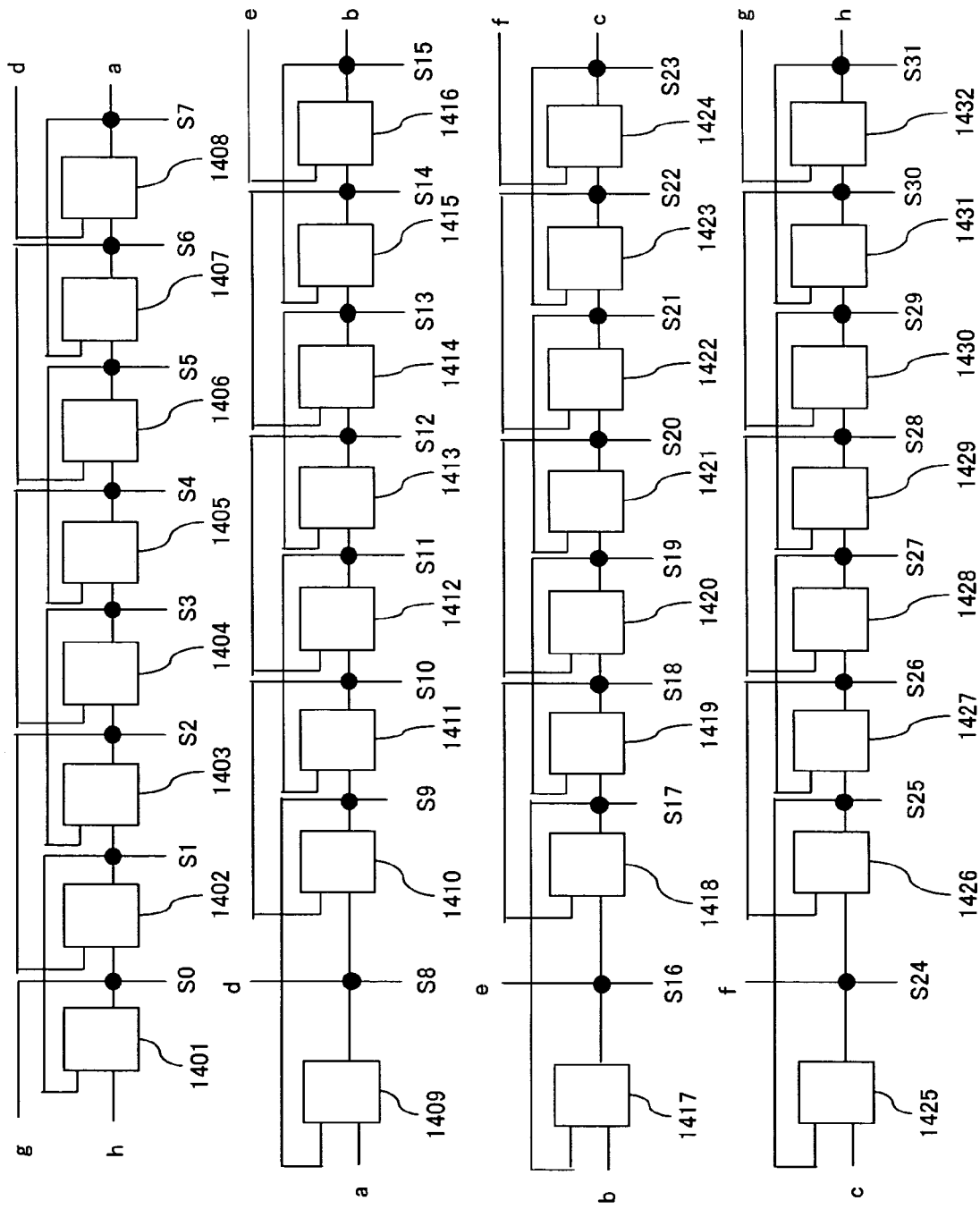
FIG. 14 shows the configuration of the first shift register circuit.

FIG. 14 shows the configuration example of the shift register circuit 302 of FIG. 3. It is assumed that the signal lines to which the same symbols are added are connected to each other from among signal lines to which symbols a to h are added. The shift register circuit of FIG. 14 comprises thirty-two basic blocks 1401 to 1432 that are serially connected and outputs control signals S0 to S31 each having thirty-two bits.

Figure 15:
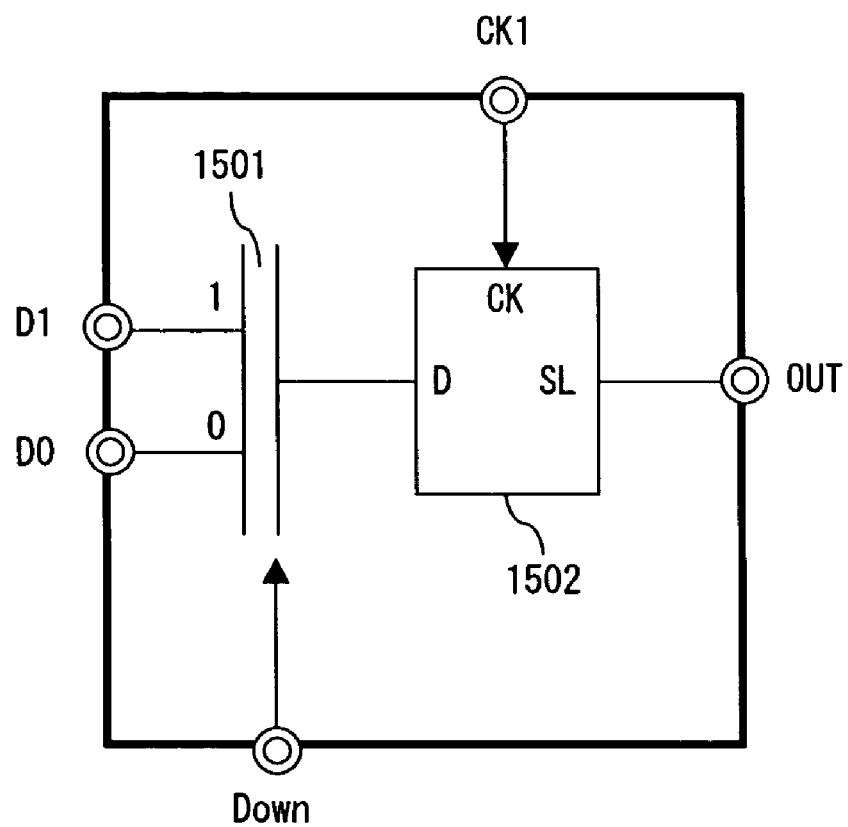
FIG. 15 shows the configuration of a basic block.

Each basic block has the configuration as shown in FIG. 15 and comprises a selector 1501 and a flip-flop circuit 1502. The flip-flop circuit 1502 retains the data that is outputted as a control signal Si (i=0, 1, . . . 31) from the basic block.

The signals from the basic blocks that are adjacent to terminals D0 and D1 in the up direction (left side) and in the down direction (right side) are respectively inputted into the two terminals. Then, the selector 1501 selects signals from the terminal D0 or D1 in accordance with the value of a control signal down that is inputted from a terminal Down and outputs the selected signal. When the control signal down is '1', an input from the terminal D1 is selected and when the control signal down is '0', an input from the terminal D0 is selected.

A timing signal sclk that is inputted into the terminal CK1 is then inputted into the terminal CK of the flip-flop circuit 1502 as a clock signal. The flip-flop circuit 1502 latches the output of the selector 1501 in accordance with the clock signal sclk and outputs this output from the terminal SL. In addition, the outputs of the flip-flop circuit 1502 are outputted as the control signal Si from a terminal OUT and at the same time, they are inputted into the terminal D1 in an up direction of the basic block and the terminal D0 in a down direction of the basic block.

In this way, each basic block latches the value of a signal that is inputted from an up-direction or a down-direction according to the value of the control signal down and shifts the latched value to the next basic block. For example, the data of any one basic block is set to '1' while the data of other basic blocks are set to '0' and then shifting operations are started.

The shift register circuit of FIG. 14 can be used to control the phase adjustment circuit of FIGS. 8 and 13. In the case of controlling the phase adjustment circuit of FIG. 13, a circuit is added to convert control signals S0 to S31 of thirty-two bits into control signals SS0 to SS4 of five bits.

Figure 16:
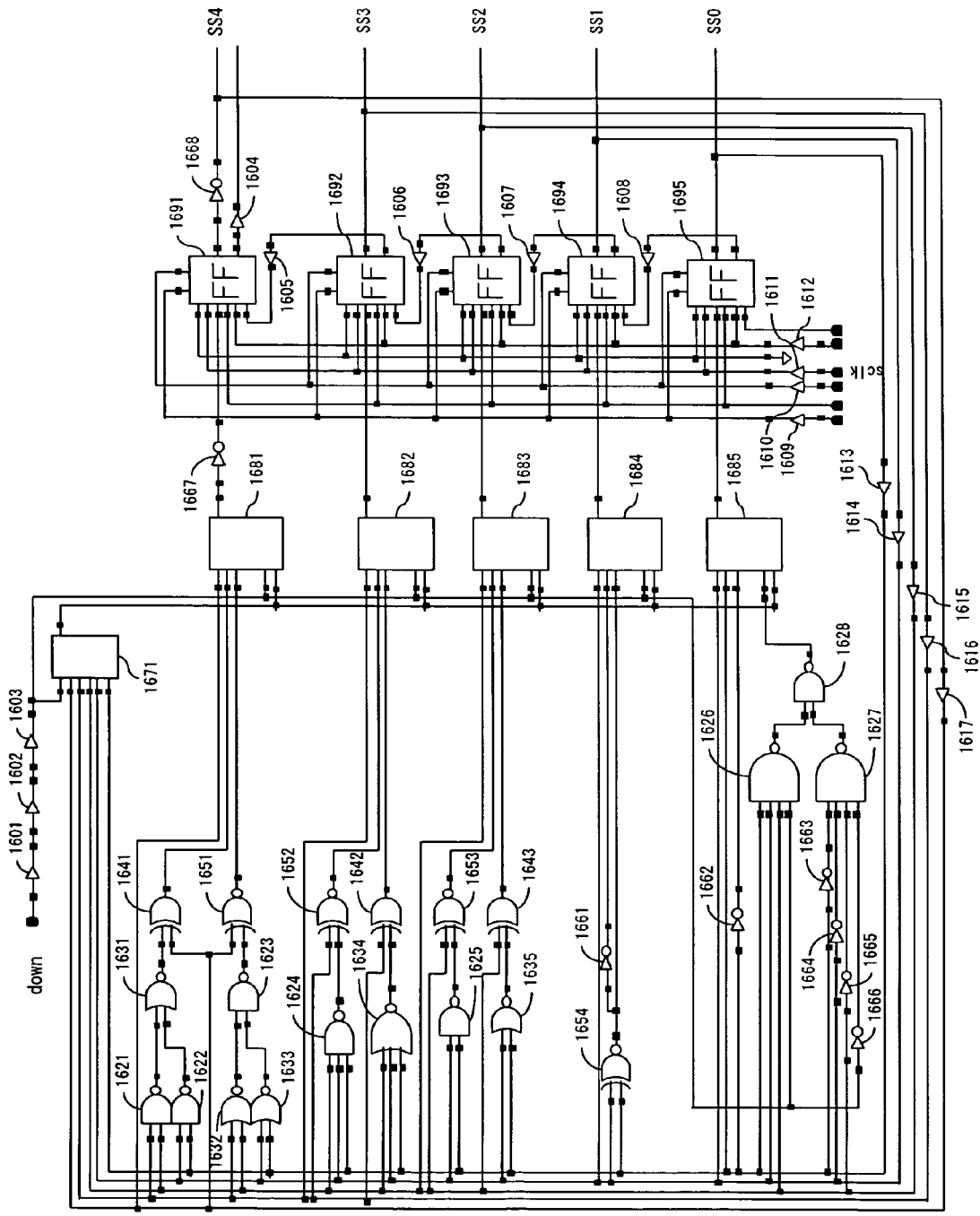
FIG. 16 shows the configuration of the second shift register circuit.

FIG. 16 shows the configuration example of the shift register circuit 302 of FIG. 3. The shift register circuit of FIG. 16 comprises buffers 1601 to 1617, NAND circuits 1621 to 1628, NOR circuits 1631 to 1635, EOR circuits 1641 to 1643, matching circuits 1651 to 1654, inverters 1661 to 1668, a digit-overflow detection circuit 1671, selectors 1681 to 1685 and D flip-flop circuits 1691 to 1695. This circuit outputs control signals SS0 to SS4 of five bits.

By counting the increase and decrease of the value of a control signal with binary digit in this configuration, the number of flip-flop circuits is decreased rather than the configuration of FIG. 14. A control signal down is inputted into the digit-overflow detection circuit 1671 and the selectors 1681 to 1685 through the buffer 1601 to 1603 while a timing signal sclk is inputted into a clock terminal of the flip-flop circuits 1691 to 1695 through the buffer 1611.

The selectors 1681 to 1685 select one of the input signals of three bits in accordance with the control signal down and an output of the digit-overflow detection circuit 1671, there by outputting the one selected signal. These inputted signals are generated using outputs of the flip-flop circuits 1691 to 1695.

The inverter 1667 inverts an output of the selector 1681, thereby outputting the inverted output and the flip-flop circuit 1691 latches an output of the inverter 1667 in accordance with a clock signal sclk. The inverter 1668 inverts an output of the flip-flop 1691 and outputs the inverted output as a control signal SS4. The flip-flop circuits 1692 to 1695 latch outputs of the selectors 1682 to 1685, respectively in accordance with the clock signal sclk and they output the latched outputs as control signals SS3 to SS0.

Signals from the buffer 1617, the EOR circuit 1641 and the matching circuit 1651 are inputted into the selector 1681. When an output of the digit-overflow detection circuit 1671 is '1', a signal from the buffer 1617 is selected and the value of a current control signal SS4 is maintained (Stay). Furthermore, when a control signal down is '1', a signal from the EOR circuit 1641 is selected (Down). When the control signal down is '0', a signal from the matching circuit 1651 is selected (Up) The operations of the selectors 1682 to 1685 are identical to that of the selector 1681.

FIG. 17 shows the configuration example of the digit-overflow detection circuit 1671 of FIG. 16. The digit overflow detection circuit of FIG. 17 comprises NAND circuits 1701 and 1702, NOR circuits 1711 to 1714, an AND circuit 1721 and an inverter 1731. Input signals A0 to A4 correspond to outputs of the buffers 1613 to 1617, respectively and the values of these input signals are identical to those of control signals SS0 to SS4. This detection circuit outputs a signal '1' showing digit-overflow, when all the input signals A0, A1 and A2 are '0' or '1'.

The shift register circuit of FIG. 16 can be used for controlling the phase adjustment circuit of FIGS. 8 and 13. In the case of controlling the phase adjustment circuit of FIG. 8, a circuit is added to convert control signals SS0 to SS4 of five bits into control signals S0 to S31 of thirty-two bits.

Figure 18:
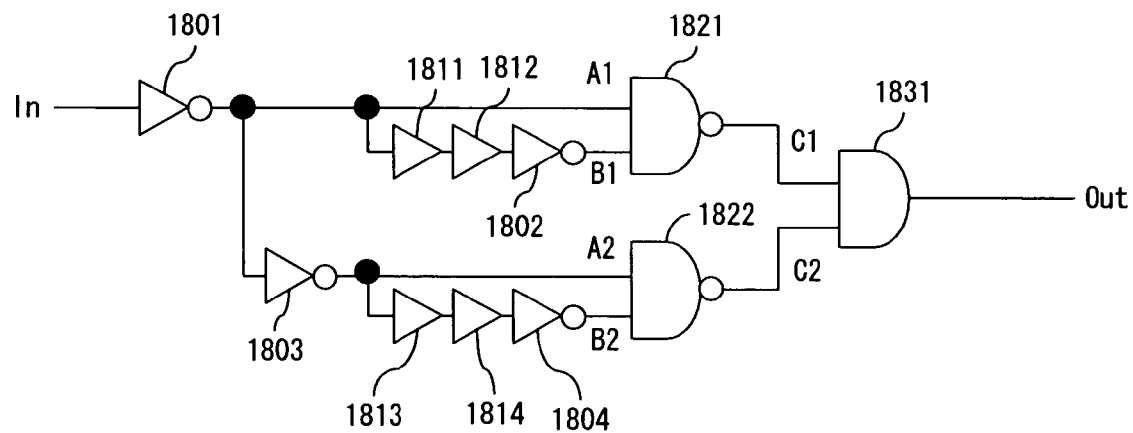
FIG. 18 shows the configuration of a strobe signal generation circuit.

FIG. 18 shows the configuration example of the strobe signal generation circuit 304 of FIG. 3. The strobe signal generation circuit of FIG. 18 comprises inverters 1801 to 1804, buffers 1811 to 1814, NAND circuits 1821 and 1822 and an AND circuit 1831. This circuit generates a signal Out in accordance with the up-edge and the down-edge of a data signal it that is inputted as a signal. In and outputs this signal as a clock signal pdclk.

FIG. 19 is the timing chart of signals In, A1, B1, C1, A2, B2, C2 and Out of FIG. 18. The signal A1 is obtained by inverting the signal. In while the signal B1 is obtained by delaying the signal A1 for a specified time period and inverting the delayed signal. The signal C1 is obtained by inverting the logical product of the signals A1 and B1. The signal A2 is obtained by inverting the signal A1. The signal B2 is obtained by delaying the signal A2 for a specified time and then inverting the delayed signal. The signal C2 is obtained by inverting the logical product of the signals A2 and B2. The signal Out is the logical product of the signals C1 and C2. The delay time periods of the signals B1 and B2 correspond to chop widths.

The thus generated signal Out has the down-edge that matches with both the up-edge and the down-edge of the signal In. Meanwhile, in the data reception circuit of FIG. 3, the strobe signal generation circuit 304 is provided to perform phase detection using both the up-edge and down-edge of the data signal it. In the case of using only the up-edge, however, the strobe signal generation circuit 304 can be omitted.

FIG. 20 shows the configuration example of the sclk generation circuit 301 of FIG. 3. The sclk generation circuit of FIG. 20 comprises flip-flop circuits 2001 to 2005 and inverters 2011 to 2015. The flip-flop circuit 2001 and the inverter 2011 function as a half divider circuit and generate a timing signal sclk of half a frequency of the data signal it (it/2).

Similarly, the flip-flop circuit 2002 and the inverter 2012 generate a timing signal sclk (it/4) having a frequency that is one-fourth of a frequency of the data signal it from the timing signal sclk (it/2). The flip-flop circuit 2003 and the inverter 2013 generate a timing signal sclk (it/8) having a frequency that is one-eighth of a frequency of the data signal it from the timing signal sclk (it/4).

Similarly, the flip-flop circuit 2004 and the inverter 2014 generate a timing signal sclk (it/16) having a frequency of one-sixteenth of a frequency of the data signal it from the timing signal sclk (it/8). The flip-flop circuit 2005 and the inverter 2015 generate a timing signal sclk (it/32) having a frequency that is one-thirty-second (1/32) of a frequency of the data signal it from the timing signal sclk (it/16).

Then, the sclk generation circuit selects any one of the timing signals in accordance with the instructed divider ratio and outputs the selected timing signal as a timing signal sclk. Which divider ratio should be used from among ½ to 1/32 may be previously determined by a simulation or dynamically determined on the basis of the operation condition of a circuit.

Figure 21:
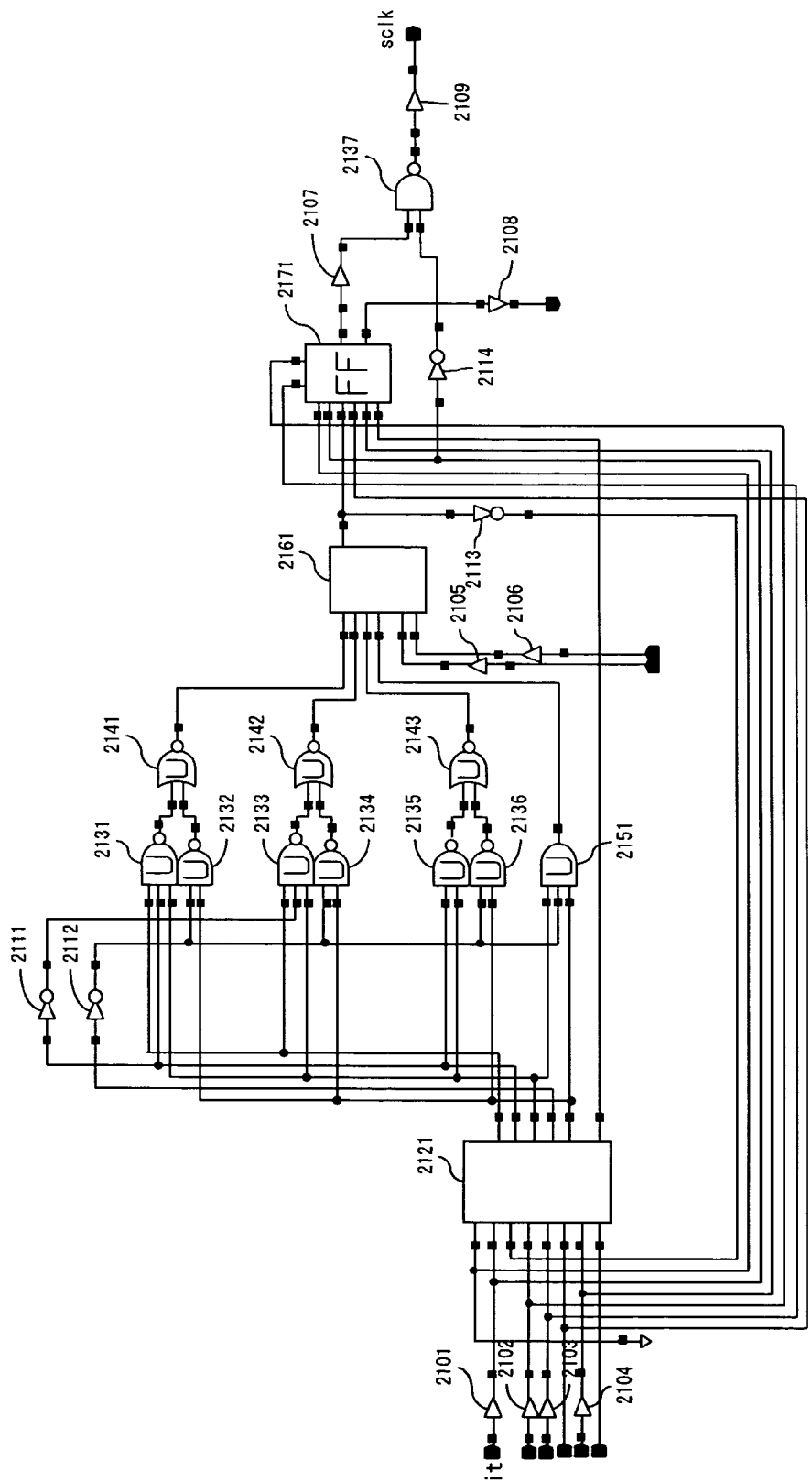
FIG. 21 shows the configuration of the second sclk generation circuit.

FIG. 21 shows another configuration example of the sclk generation circuit 301 of FIG. 3. The sclk generation circuit of FIG. 21 comprises buffers 2101 to 2109, inverters 2111 to 2114, a counter circuit 2121, NAND circuits 2131 to 2137, NOR circuits 2141 to 2143, an AND circuit 2151, a selector 2161 and a D flip-flop circuit 2171 and generates a timing signal sclk from a data signal it.

In this configuration, the number of edges of the data signal it is counted by using not a divider circuit but a counter circuit 2121 and generates the edge of a timing signal sclk when the predetermined number of counting edges is detected.

The counter circuit 2121 counts the number of edges of the data signal it and outputs the count value of five bits. A signal of four bits that is generated using this count value is inputted into the selector 2161 and a count number is set up through the buffers 2105 and 2106. The selector 2161 selects one of the input signals of four bits and outputs the selected signal to the flip-flop circuit 2171 and the inverter 2113.

The inverter 2113 inverts an output of the selector 2161 and generates a counter clear signal, thereby outputting this signal to the counter circuit 2121. The flip-flop circuit 2171 latches the output of the selector 2161 in accordance with the data signal it and outputs the latched output to the buffer 2107. Furthermore, the inverter 2114 inverts the data signal it and outputs the inverted signal.

The NAND circuit 2137 inverts the logical product of the outputs of the buffer 2107 and the inverter 2114 and outputs the inverted logical product. The buffer 2109 outputs the output of the NAND circuit 2137 as a timing signal sclk.

Figure 22:
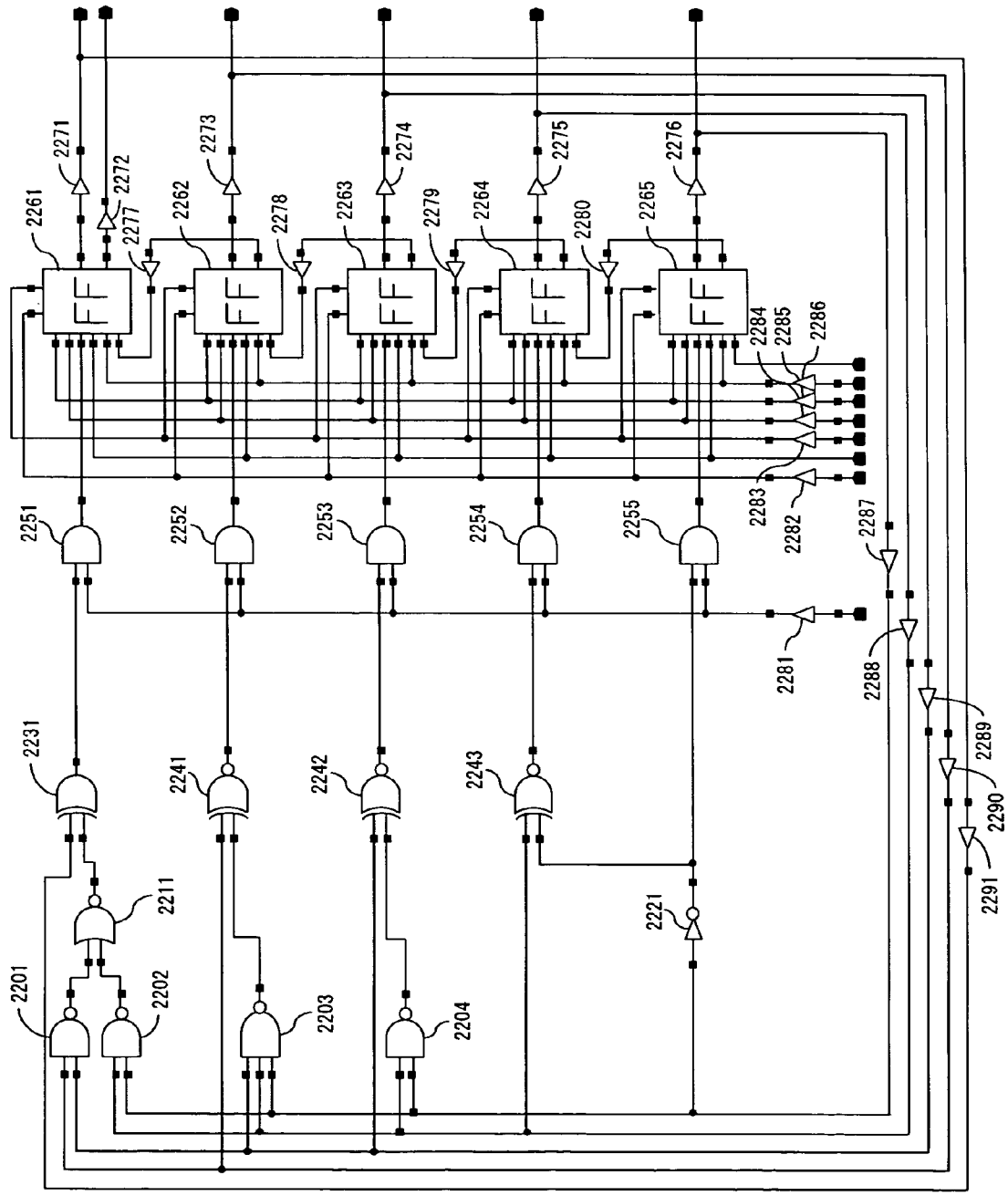
FIG. 22 shows the configuration of a counter circuit.

FIG. 22 shows the configuration example of the counter circuit 2121 of FIG. 21. The counter circuit of FIG. 22 comprises NAND circuits 2201 to 2204, a NOR circuit 2211, an inverter 2221, an EOR circuit 2231, matching circuits 2241 to 2243, two-input AND circuits 2251 to 2255, flip-flop circuits 2261 to 2265 and buffers 2271 to 2291.

The data signal it is inputted into each of the clock terminals of the flip-flop circuits 2261 to 2265 through the buffer 2284. The counter clear signal is inputted into the input terminal on one side of each of the AND circuit 2251 to 2255 through the buffer 2281. Signals that are generated using the outputs of the flip-flop circuits 2261 to 2265 are inputted into the input terminals on other sides of the AND circuits 2251 to 2255.

The flip-flop circuits 2261 to 2265 latch outputs of the AND circuits 2251 to 2255, respectively in accordance with the data signal it and they output the latched outputs as counter values through the buffers 2271 and 2273 to 2276.

Figure 23:
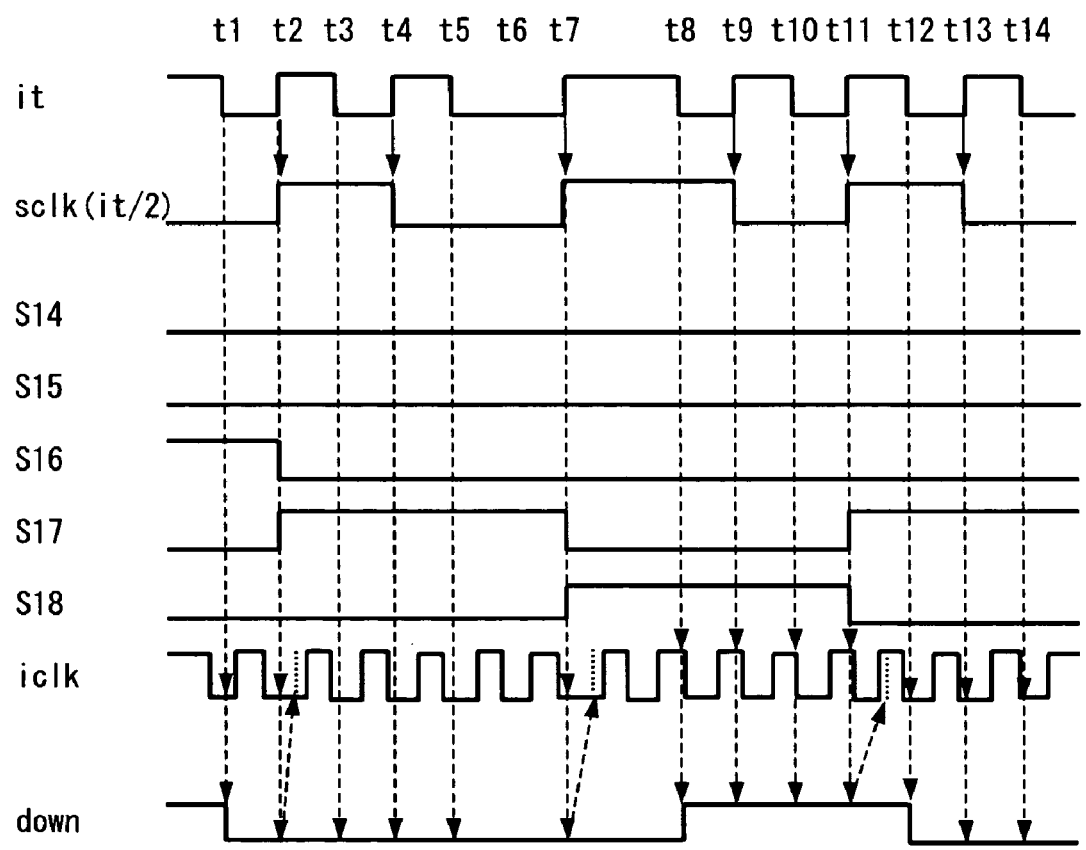
FIG. 23 is the timing chart of a control signal at the time of phase adjustment.

FIG. 23 is the timing chart that shows the changes of control signals S14 to S18 in the case of using the phase adjustment circuit of FIG. 8, the shift register circuit of FIG. 14 and the sclk generation circuit of FIG. 20. As a timing signal sclk, the sclk (it/2) is used. In order to clear the drawing, the phase deviation of the clock signal iclk that is generated by the movement of the signal value '1' among control signals S16 to S18 is exaggerated more than the phase deviation in an actual circuit.

Respective times t1 to t14 correspond to the up-edge/down-edge of a data signal it and a control signal down is updated at each time. At the time t2, the shift register circuit 302 recognizes down='0' by the up-edge of a timing signal sclk and moves the signal value '1' of a control signal S16 to a control signal S17. In this way, a clock signal iclk retreats.

After that, the shift register circuit 302 recognizes down='0' by the up-edge of the timing signal sclk at time t7 and moves the signal value '1' of the control signal S17 to a control signal S18. In this way, the clock signal iclk further retreats.

Then, the shift register circuit 302 recognizes down='1' by the up-edge of the timing signal sclk at time t11 and moves the signal value '1' of the control signal S18 to the control signal S17. In this way, the clock signal iclk advances. At this time, the edge of the data signal it almost matches with the down-edge of the clock signal iclk at this point and the data signal it can be received by the up-edge of the clock signal iclk.

The present invention can be applied to not only the data transmission among LSIs but also various processings for adjusting a clock signal in the reception apparatus that receives data from a transmission apparatus.

What is claimed is:

1. A clock adjustment apparatus comprising:
  a phase adjustment device delaying an inputted clock signal and adjusting a phase of the clock signal, thereby outputting the adjusted clock signal;
  a phase detection device detecting a phase relation between an inputted data signal that is different from the inputted clock signal and the adjusted clock signal, and outputting a first control signal showing the phase relation;
  a control device determining whether a delay amount of the phase adjustment device is increased or decreased in accordance with the first control signal and generating a second control signal for increasing or decreasing the delay amount in accordance with an inputted timing signal that is different from the inputted clock signal, thereby outputting the generated second control signal to the phase adjustment device, and
  a generation device generating the timing signal using an edge of the data signal.

2. The clock adjustment apparatus according to claim 1, wherein the generation device generates the timing signal by dividing the data signal.

3. The clock adjustment apparatus according to claim 1, wherein the generation device generates an edge of the timing signal when the device counts edges of the data signal and detects edges a predetermined number of times.

4. The clock adjustment apparatus according to claim 2, further comprising a latch device latching a value of the data signal in accordance with the adjusted clock signal.

5. The clock adjustment apparatus according to claim 1, wherein the phase adjustment apparatus includes a plurality of inverter devices that are serially connected to each other, selects a clock signal outputted from one of the inverter devices in accordance with a value of the second control signal when the inputted clock signal passes through the plurality of inverter devices and outputs the selected clock signal as the adjusted clock signal.

6. The clock adjustment apparatus according to claim 1, wherein the phase adjustment device includes a plurality of inverter devices that are serially connected to each other and a capacitor device connected to an input of each inverter device via a switch device, controls each switch device in accordance with a value of the second control signal when the inputted clock signal passes through the plurality of inverter devices and outputs a clock signal outputted from a last inverter device as the adjusted clock signal.

7. The clock adjustment apparatus according to claim 1, wherein the phase detection device comprises a flip-flop device latching a value of the adjusted clock signal in accordance with a clock signal that uses an edge of the data signal and outputting the latched value as the first control signal.

8. The clock adjustment apparatus according to claim 7, wherein the phase detection device comprises a signal generation device generating a clock signal that uses an edge of the data signal, using both an up-edge and a down-edge of the data signal.

9. The clock adjustment apparatus according to claim 1, wherein the control device increases or decreases a delay amount of the phase adjustment device in such a way that an edge different from an effective edge of the adjustment clock signal approaches an edge of the data signal.

10. The clock adjustment apparatus according to claim 1, wherein the control device comprises a shift register device retaining a value of each bit when the second control signal includes a plurality of bits and shifting the retained value in one of directions of two adjacent bits in accordance with the timing signal and it determines a shift direction of the shift register device in accordance with the first control signal.

11. The clock adjustment apparatus according to claim 1, wherein:
  the control device comprises a flip-flop device retaining a value of each bit when the second control signal includes a plurality of bits and a selector device selecting one signal from among signals of a plurality of bits generated from an output of the flip-flop device in accordance with the first control signal, thereby outputting the selected signal to the flip-flop device; and
  the flip-flop device latches an output of the selector device in accordance with the timing signal and outputs the latched output as the second control signal.

12. A clock adjustment method, comprising:
  delaying an inputted clock signal and adjusting a phase of the clock signal using a phase adjustment device;
  detecting a phase relation between an inputted data signal that is different from the inputted clock signal and the adjusted clock signal;
  determining whether a delay amount of the phase adjustment device is increased or decreased in accordance with a first control signal showing the phase relation; and
  generating a second control signal for increasing or decreasing the delay amount in accordance with an inputted timing signal that is different from the inputted clock signal and generated using an edge of the data signal, and outputting the second control signal to the phase adjustment device.

13. A clock adjustment apparatus, comprising:
  phase adjustment means for delaying an inputted clock signal and adjusting a phase of the clock signal, thereby outputting the adjusted clock signal;
  phase detection means for detecting a phase relation between an inputted data signal that is different from the inputted clock signal and the adjusted clock signal, and outputting a first control signal showing the phase relation; and
  control means for determining whether a delay amount of the phase adjustment means is increased or decreased in accordance with the first control signal and generating a second control signal for increasing or decreasing the delay amount in accordance with an inputted timing signal that is different from the inputted clock signal, thereby outputting the generated second control signal to the phase adjustment means; and generation means for generating the timing signal using an edge of the data signal.

* * * * *